United States Patent [19]

Kenzo et al.

[11] Patent Number: 4,994,140
[45] Date of Patent: Feb. 19, 1991

[54] METHOD CAPABLE OF FORMING A FINE PATTERN WITHOUT CRYSTAL DEFECTS

[75] Inventors: Akita Kenzo, Kanagawa; Mototaka Taneya, Nara; Yoshimasa Sugimoto; Hiroshi Hidaka, both of Ibaraki, all of Japan

[73] Assignee: Optoelectronics Technology Research Corporation, Tokyo, Japan

[21] Appl. No.: 463,205

[22] Filed: Jan. 10, 1990

[30] Foreign Application Priority Data

| | | | |
|---|---|---|---|
| Jan. 10, 1989 | [JP] | Japan | 1-2143 |
| Apr. 28, 1989 | [JP] | Japan | 1-107865 |
| Jun. 27, 1989 | [JP] | Japan | 1-62683 |
| Dec. 25, 1989 | [JP] | Japan | 1-332640 |

[51] Int. Cl.$^5$ .............. H01L 21/306; B44C 1/22; C03C 15/00; C03C 25/06
[52] U.S. Cl. .................. 156/643; 156/646; 156/659.1; 156/662; 156/345; 704/192.3; 704/192.34; 704/798.36; 219/121.19; 219/121.2; 219/121.33; 427/38; 437/228
[58] Field of Search .............. 156/643, 646, 653, 657, 156/659.1, 662, 345; 427/38; 204/192.3, 192.32, 192.34, 192.35, 192.37, 298.36; 437/105, 106, 107, 126, 228, 234; 219/121.19, 121.2, 121.33

[56] References Cited

U.S. PATENT DOCUMENTS

| | | | |
|---|---|---|---|
| 3,360,398 | 12/1967 | Garibotti | 219/121.2 X |
| 4,477,311 | 10/1984 | Mimura et al. | 156/643 |
| 4,496,449 | 1/1985 | Rocca et al. | 204/298.36 |
| 4,599,135 | 7/1986 | Rocca et al. | 204/298.36 |
| 4,734,158 | 3/1988 | Gillis | 156/643 |
| 4,874,459 | 10/1989 | Coldren et al. | 156/643 |

Primary Examiner—William A. Powell
Attorney, Agent, or Firm—Sughrue, Mion, Zinn, Macpeak & Seas

[57] ABSTRACT

In a method of processing a compound semiconductor wafer to deposit or form a specific layer on a wafer surface, to partially remove the specific layer to partially expose the wafer surface, and to etch a partially exposed area of the wafer, etching is performed by irradiating an electron beam and a specific gas which may be, for example, chlorine gas, bromine gas, iodine, or their compounds. Portions subjected to irradiation of both the electron beam and the specific gas are etched from the wafer. The specific layer is deposited or formed in the form of an oxide layer on the wafer surface by spraying an oxygen gas onto the wafer surface with light irradiated on the wafer surface. Such an oxide layer may be either an adsorbed molecular layer of the oxygen gas or a chemically reacted layer which results from reaction of the oxygen gas with the wafer by the help of irradiation of the light. Alternatively, the specific layer may be either a sulphide layer or a nitride layer. The specific layer and the wafer may be removed and etched by the use of different gases which may be a hydrogen gas and a chlorine gas, respectively. In addition, the above-mentioned processing may be carried out without exposure of the wafer to air by the use of an apparatus which comprises a plurality of rooms or chambers airtightly coupled to one another.

16 Claims, 4 Drawing Sheets

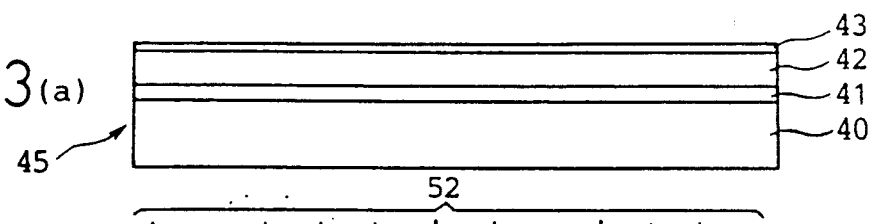
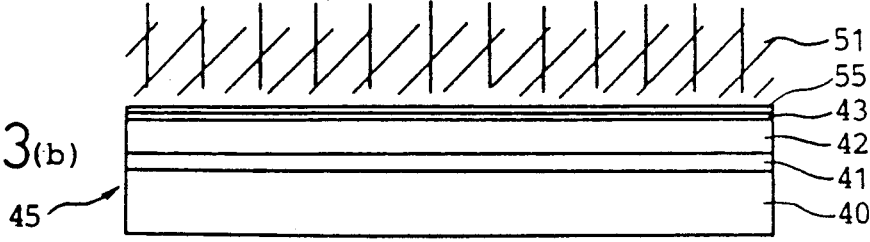
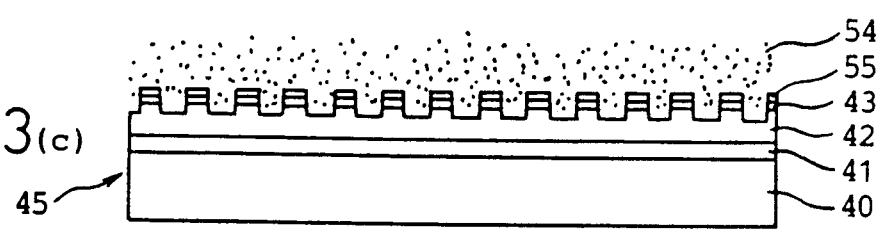
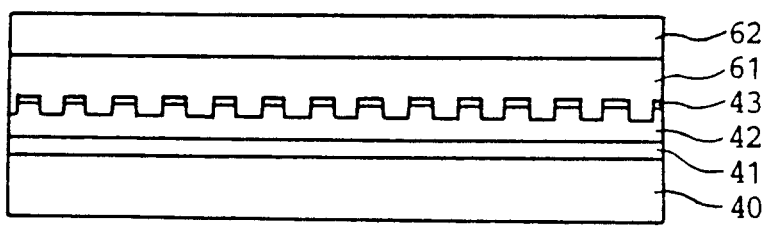
FIG. 4

METHOD CAPABLE OF FORMING A FINE PATTERN WITHOUT CRYSTAL DEFECTS

BACKGROUND OF THE INVENTION:

This invention relates to a method of processing a wafer of a compound semiconductor to leave a pattern on the surface of the wafer. In addition, this invention relates to an apparatus for use in carrying out a method of the type described. It is to be noted throughout the instant specification that the wafer may have at least one deposition layer of a semiconductor.

In general, a wide variety of compound semiconductors have been proposed and applied to various kinds of devices. Among others, a III-V compound semiconductor is very useful for manufacturing a semiconductor laser device, a field effect transistor device, and the like. In order to manufacture such various devices of the III-V compound semiconductor, which may be called III-V compound semiconductor devices, a pattern should be formed or remain on a wafer of such a III-V compound semiconductor. For this purpose, the wafer is processed to deposit a layer on the surface of the wafer and to selectively etch the layer and/or the wafer.

A recent requirement is to establish high performance and an improved function of such a III-V compound semiconductor device. To this end, attention has been directed to accurately or controllably forming a very fine structure which has a pattern smaller in size than 10 nm.

In a conventional method which has been widely used to form a pattern on a wafer of a III-V compound semiconductor, an organic resist is coated on or applied to a wafer surface to form a resist layer. Subsequently, the resist layer is exposed by light or an electron beam and developed by the use of an alkaline liquid into a mask which has a mask pattern. The wafer is etched through the mask by the use of an etchant. Thus, the mask pattern is transferred to the wafer surface and remains as the pattern on the wafer. However, it is difficult with this method to accurately delineate a pattern which has a size smaller than 100 nm.

Alternatively, a focused ion beam (FIB) is recently used to directly etch a wafer of a III-V compound semiconductor to form a pattern on the wafer, without the organic resist. For example, a gas etching method has been proposed in an article contributed by Ochiai et al to Journal of Vacuum Science and Technology, B3, 657 (1985). Specifically, a specimen is etched by the use of both the focused ion beam and chlorine gas. This gas etching may be referred to as a FIB assisted chlorine gas etching.

With this method, it is possible to comparatively readily delineate a pattern which is smaller in size than 100 nm. However, the gas etching is disadvantageous in that a great number of crystal defects take place in the specimen due to irradiation of the focused ion beam. In order to reduce occurrence of such crystal defects, consideration might be made about using a low energy ion beam or about heating a wafer on forming a pattern. Such use of a low energy ion or heating the wafer is helpful to reduce the crystal defects to some extent. However, it is impossible to completely remove such crystal defects by the use of the above-mentioned gas etching.

In the meanwhile, it is to be noted that crystal growth and etching are repeated several times on manufacturing semiconductor devices formed by the use of a compound semiconductor. In addition, a diffusion process often becomes necessary to diffuse an impurity into a wafer on manufacturing such devices. In this event, the wafer is inevitably exposed to air each time when the crystal growth, the etching, and the diffusion are performed. This means that the wafer surface is exposed to air again and again during manufacturing the semiconductor devices. As a result, the wafer surface is undesirably contaminated by adhesion of oxygen, carbon, and the like. Such contamination of a wafer surface gives rise to degradation of characterises, such as an increase of a leak current, in semiconductor devices manufactured, as mentioned above.

SUMMARY OF THE INVENTION

It is an object of this invention to provide a method of processing a wafer of a compound semiconductor, which is capable of delineating a fine pattern which is smaller in size than 100 nm.

It is another object of this invention to provide a method of the type described, which is capable of avoiding crystal defects which might occur on etching wafer.

It is still another object of this invention to provide an apparatus which is capable of processing a wafer without exposure of the wafer to air.

It is yet another object of this invention to provide an apparatus of the type described, which is capable of processing a wafer without contaminating a wafer surface processed.

It is a further object of this invention to provide an apparatus which is applicable to the method mentioned above.

A method to which this invention is applicable is for use in processing a wafer which is composed of a compound semiconductor and which has a wafer surface. According to this invention, the method comprises the steps of forming a specific layer on the wafer surface and selectively etching the specific layer by introducing an electron beam and a specific gas onto the specific layer to form a predetermined pattern on the wafer surface.

BRIEF DESCRIPTION OF THE DRAWING

FIGS. 3(a), (b), and (c) are sectional views for use in describing a method according to a first embodiment of this invention;

FIG. 4 is another sectional view for use in describing a method according to a second embodiment of this invention.

DESCRIPTION OF THE PREFERRED EMBODIMENTS

Figure 1:
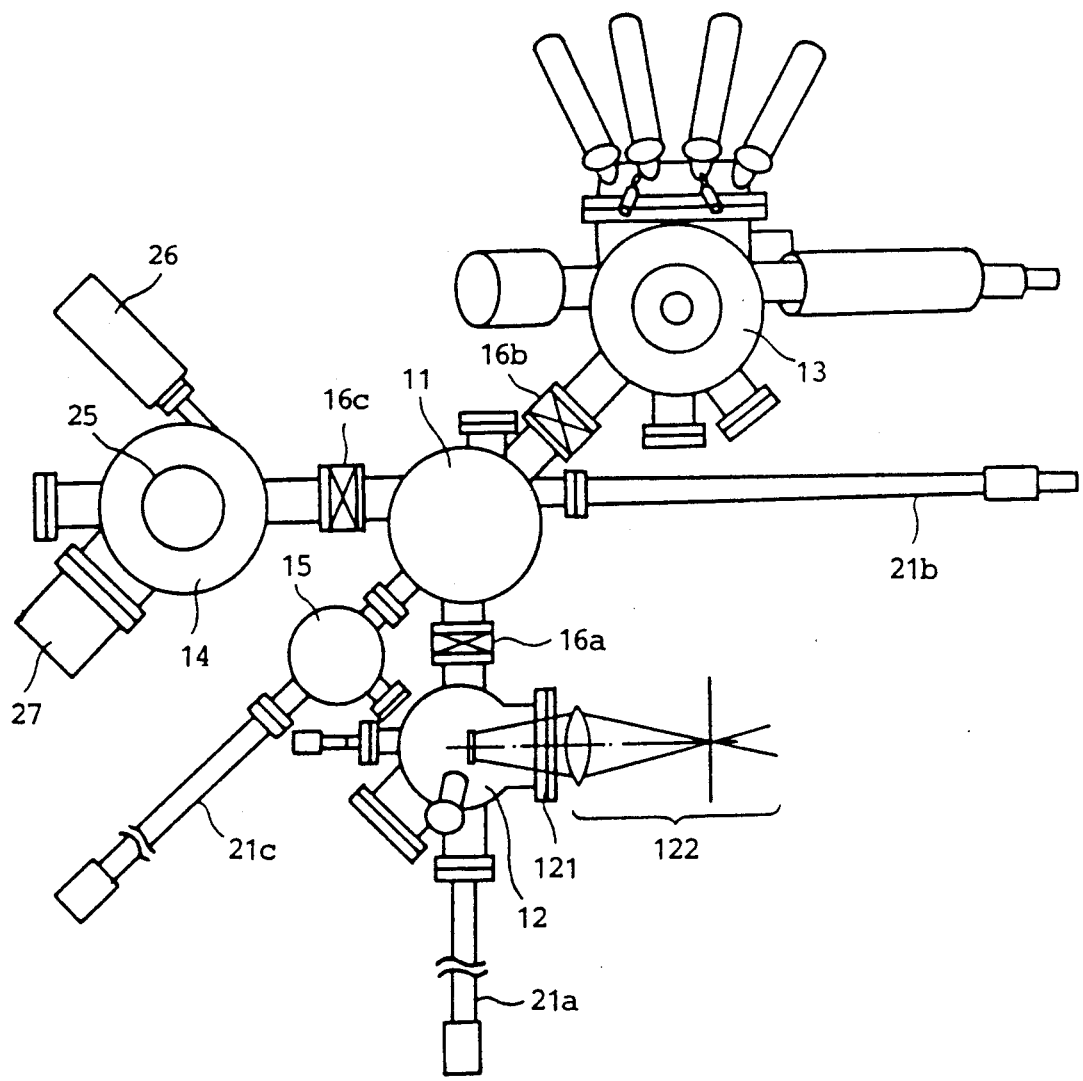
FIG. 1 is a schematic view of an apparatus for use in carrying out a method according to this invention.

Referring to FIG. 1, a method according to a preferred embodiment of this invention is carried out by the use of an apparatus illustrated in FIG. 1. The illustrated apparatus comprises an exchange chamber 11, a deposition chamber 12, a molecular beam epitaxy (abbreviated to MBE) chamber 13, an etching chamber 14, and a heating chamber 15. The deposition chamber 12, the MBE chamber 13, and the etching chamber 14 are connected to the exchange chamber 11 through first, second, and third gate valves 16a, 16b, and 16c which are known in the art, respectively. The exchange chamber 11 is operable as a passage for transferring a specimen from one chamber to another, as will become clear later. First through third magnetic feed throughs 21a, 21b, and 21c are coupled to the deposition chamber 12, the etching chamber 14, and both the MBE chamber 13 and the heating chamber 15, respectively, and serve to transport the specimen from one chamber to another without exposure of the specimen to air.

The illustrated deposition chamber 12 has a window 121 for allowing light to pass therethrough. An optical system 122 is located outside of the window 121 and is optically coupled to the window 121 to introduce light or an optical beam into the deposition chamber 12 and comprises an optical source, a lens, and other parts. Such an optical beam is emitted from a halogen lamp (not shown). A gas introduction portion with a valve (not shown) is attached to the deposition chamber 12 to introduce a specific gas, such as an oxygen, into the deposition chamber. The specific gas may be referred to as a first gas. In this connection, the gas introduction portion may be called a first gas introduction portion. At any rate, the deposition chamber 12 serves to form an adsorbed molecular layer of the specific gas or a chemically reacted layer which results from reaction of the specific gas with the specimen.

A plurality of effusion cells are attached to the MBE chamber 13. Such effusion cells may effuse, for example, gallium molecules, arsenium molecules, aluminum molecules, and the like.

Figure 2:
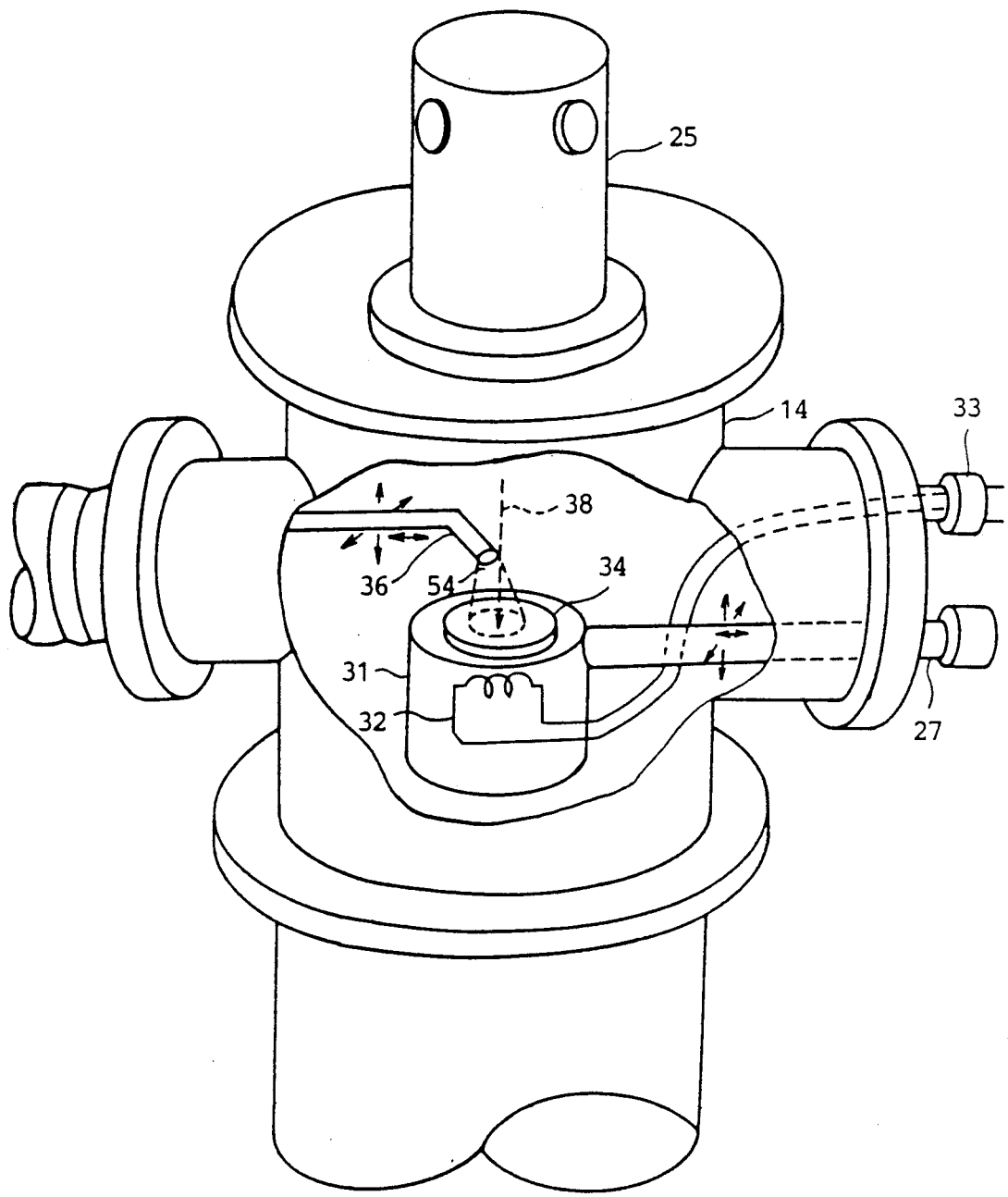
FIG. 2 is a schematic view of a part of the apparatus with a part cut away.

Temporarily, referring to FIG. 2 together with FIG. 1, the etching chamber 14 is connected with an electron beam generator or an electron gun 25, a second gas inlet unit 26 for introducing an etching gas which may be named a second gas, and a manipulator 27 for adjusting a location of a specimen within the etching chamber 14. As illustrated more in detail in FIG. 2, the etching chamber 14 has a hollow space therein. The manipulator 27 is coupled to a support member 31 within the hollow space. Consequently, the support member 31 is movable upwards, downwards, forwards, backwards, rightwards, and leftwards of FIG. 2, as depicted at arrowheads in FIG. 2 and defines an upper surface. A heater 32 is embedded in the support member 31 and is connected through a conductor and a current input port 33 to an electric source (not shown) located outside of the etching chamber 14.

On the upper surface of the support member 31, a specimen depicted at 34 is placed to be etched within the etching chamber 14. A gas nozzle 36 is extended over the upper surface of the support member 31 and is movable, as suggested by arrowheads in FIG. 2. Thus, an etching gas is directed to the specimen 34 through the nozzle 36. Consequently, the specimen 34 is locally or partially irradiated by the etching gas, as shown by a broken line. In addition, an electron beam 38 is irradiated on the specimen from the electron beam generator 25 illustrated upwards of FIG. 2.

Referring to FIG. 3 afresh in addition to FIGS. 1 and 2, description will be made about the method according to this invention on the assumption that a semiconductor device is manufactured by the use of the apparatus illustrated in FIGS. 1 and 2. In this event, a substrate 40 (FIG. 3) of gallium arsenide (GaAs) is at first prepared as a specimen and is entered into the deposition chamber 12 (FIG. 1). Thus, the substrate 40 is composed of a compound semiconductor and is transported from the deposition chamber 12 to the heating chamber 15 by the use of the first and the third magnetic feed throughs 21a and 21c. Thereafter, a pressure is reduced to less than $1 \times 10^{-8}$ Torr in the heating chamber 15. Under the circumstances, the substrate 40 is heated to a temperature of about 200° C. by a heater (not shown) placed in the heating chamber 15 and is kept about 20 minutes. During this heat treatment, water molecules is removed from a surface of the substrate 40.

Subsequently, the substrate 40 subjected to the above-mentioned heat treatment is transported from the heating chamber 15 to the MBE chamber 13 by the use of the third magnetic feed through 21c. Within the MBE chamber 13, molecular beam epitaxy is successively performed to form a buffer layer 41 of gallium arsenide (GaAs), a clad layer 42 of aluminum-gallium-arsenide ($Al_xGa_{1-x}As$), and a guide layer 43 of gallium arsenide (GaAs), where x is between 0 and 1, both exclusive. Such layers 41, 42, and 43 can be continuously grown by the use of the illustrated apparatus by selecting the effusion cells and form a wafer 45 (FIG. 3(a)) together with the substrate 40. The wafer 45 has a wafer surface defined by the guide layer 43. In the example being illustrated, the buffer layer 41, the clad layer 42, and the guide layer 43 have thicknesses of 0.2 micron, 1.2 microns, and 0.2 micron, respectively.

The wafer 45 is transported from the MBE chamber 13 to the deposition chamber 12 through the exchange chamber 11 by the third magnetic feed through 21b and the like.

The deposition chamber 12 is evacuated by a vacuum pump, such as a turbo molecular pump, an ion pump, and kept at a residual gas pressure less than $1 \times 10^{-8}$ Torr. In this situation, the deposition chamber 12, in which the wafer 45 had been held, is filled with a hyperpure oxygen gas to a partial pressure of $1 \times 10^{-6}$ Torr. The hyperpure oxygen gas is introduced onto the wafer 45, as suggested at 51 in FIG. 3(b), while light is irradiated onto the wafer 45 from a halogen lamp, as shown at 52 in FIG. 3(b). The light may be called halogen lamp light and has an optical irradiation energy density of 50 J/cm$^2$ on the wafer 45. The halogen lamp light is converged by the optical system 122 (FIG. 1) onto the wafer 45 in the deposition chamber 12. As a result of the above-mentioned processing, an oxide layer 55 is formed on the surface of the wafer 45, as illustrated in FIG. 3(b), and has a density and a thickness which can be controlled in dependency on the optical irradiation energy density, the partial pressure of oxygen, and a substrate temperature.

It is to be noted that such an oxide layer 55 may be formed on the wafer surface as an adsorbed molecular layer of the oxygen and/or as a chemically reacted layer which results from reaction of the oxygen with the wafer surface by the help of the halogen lamp light.

Thereafter, the deposition chamber 12 is exhausted by the vacuum pump to a pressure less than $1 \times 10^{-7}$ Torr. The wafer 40 on which the oxide layer 55 is formed is transported from the deposition chamber 12 to the etching chamber 14.

Within the etching chamber 14, the above-mentioned wafer 40 is heated to a temperature of 70° C. by the heater 32 (FIG. 2) while a chlorine gas 54 (FIG. 3(c)) is introduced into the etching chamber 14 through the gas nozzle 36. Thus, a pressure of the etching chamber 14 rises to $1 \times 10^{-5}$ Torr. In the example being illustrated, the electron beam 38 (FIG. 2) is emitted from the electron beam generator 25 and is irradiated onto the oxide layer 55. The electron beam 38 is focused and has a beam diameter of 50 nm and an electric current of 10 pA. The electron beam is scanned on the oxide layer 55 so that a predetermined pattern is delineated on the oxide layer 55. With this electron beam 38, it is possible to delineate, as the predetermined pattern, a line and space pattern having a width of 150 nm.

The oxide layer 55 is partially etched or removed from the surface of the wafer 45 only at portions irradiated by both the electron beam 38 and the chlorine gas 54. More specifically, the chlorine gas 54 is broadly sprayed or irradiated from the nozzle 36 over a wide range having a diameter of several millimeters. On the other hand, the electron beam 38 is very narrow, as mentioned before. Therefore, the oxide layer 55 is scanned by the electron beam 38 to such narrow area as less than 100 nm in width. Consequently, such an exposed oxide layer is removed from the wafer surface to form the line and space pattern, as mentioned before. In this case, the electron beam 38 has electron beam energy of 10 keV. In order to remove the above-mentioned oxide layer 55, the electron beam 38 should have a dose of about $5 \times 10^{16}$ cm$^{-2}$. Such a dose is variable in dependency upon a manufacturing process of the oxide layer 55 determined by the oxygen gas pressure and the optical irradiation energy density. Specifically, the dose tends to be increased with an increase of each of the oxygen gas pressure and the optical irradiation energy density.

During irradiation of the electron beam 38, the oxide layer 55 is partially removed from the wafer surface at the portions on which the electron beam 38 is irradiated. The portions are exposed to the chlorine gas in the hollow space of the etching chamber 14 and etched by the chlorine gas 54. As a result, not only the guide layer 43 of GaAs which is an uppermost one is etched by the chlorine gas but also the clad layer 42 is also effectively etched by the chlorine gas 54. It has been found out that the clad layer 43 is etched by the chlorine gas 54 at the same etching rate as the guide layer 43. In any event, both the guide and the clad layers 43 and 42 are etched at a substantially equal rate through the oxide layer 55, as illustrated in FIG. 3(c).

From this fact, it is readily understood that a desired line and space pattern is formed on the wafer by contacting oxygen with a compound semiconductor surface in addition to irradition of light on the surface to form an oxide layer of the compound semiconductor and thereafter by irradiating both a chlorine gas and an electron beam on the compound semiconductor heated.

Although description has been made about using the oxygen to form an oxide layer in the above-mentioned embodiment, similar results have been obtained even when carbon dioxide ($CO_2$), ozone ($O_3$), or water vapor may be used instead of the oxygen.

In addition, the compound semiconductor may be heated to a temperature which is higher or lower than 70° C. after formation of the oxide layer. In this event, when the temperature is lower than 70° C., a long time is necessary to remove the oxide layer by the use of the chlorine gas and the electron beam and etching rate of the compound semiconductor becomes small.

On the other hand, when the temperature is higher than 70° C., the time for removing the oxide layer becomes short and the etching rate becomes large. However, it is to be noted in this case that the oxide layer should have a property which is favorably resistant enough against the chlorine gas. For this purpose, the oxide layer is preferably formed by irradiating light for a long time.

Referring to FIG. 4 together with FIGS. 1 and 3, a method according to a second embodiment of this invention is for use in manufacturing a semiconductor laser device of a buried type. In this case, it is assumed that manufacturing such a semiconductor device is performed in a manner similar to that by the use of the apparatus illustrated in FIG. 1. Accordingly, a substrate 40 of gallium arsenide is transported from the deposition chamber 12 to the heating chamber 15 to be heated to a temperature of 200° C. and is thereafter transported to the MBE chamber 13. In the MBE chamber 13, the buffer layer 41 of gallium arsenide, the clad layer 42 of the aluminum-gallium-arsenide ($Al_xGa_{1-x}As$), and the guide layer 43 of gallium arsenide are successively deposited or grown on the substrate 40 to form a wafer 45 in the manner illustrated in FIG. 3(a). After such growth of the buffer, the clad, and the guide layers 41, 42, and 43, the wafer 45 is transported from the MBE chamber 13 to the deposition chamber 12 to form an oxide layer 55, as illustrated in FIG. 3(b). The oxide layer 55 is formed by irradiating light 51 on the wafer 45 by a halogen lamp (not shown) under an oxygen atmosphere.

Thereafter, the wafer 45 is transferred from the MBE chamber 13 to the etching chamber 14 where the wafer is to be etched. During the etching, the chlorine gas 54 and the electron beam are irradiated onto the wafer surface, as shown in FIG. 3(c). Consequently, the oxide layer 55, the guide layer 43, and a part of the clad layer 42 are etched by the chlorine gas 54. As a result, the wafer 45 is patterned, as illustrated in FIG. 3(c), and may be referred to as a patterned wafer.

Subsequently, the patterned wafer is transported from the etching chamber 14 to the MBE chamber 13 again. In the MBE chamber 13, the patterned wafer is irradiated by an arsenic molecular beam and is heated to a temperature higher than 550° C. Such a heat treatment is for cleaning a surface of the patterned wafer and lasts for about one hour. This cleaning process is carried out to remove both oxide layer on the top layer and a chlorine compound attached to the oxide layer 55, the guide layer 43, and the clad layer 42 during the etching. Thus, it is possible to obtain a pure crystal surface of gallium arsenide. Additionally, such cleaning is monitored by a method which is known in the art as reflection high energy electron diffraction (RHEED).

After the cleaning, an additional clad layer 61 of aluminum-gallium-arsenide ($Al_xGa_{1-x}As$) and an oxidation protection layer 62 of gallium arsenide (GaAs) are successively deposited to thicknesses of 1.5 micron meters and 0.1 micron meter, respectively, as illustrated in FIG. 4. Thus, the semiconductor laser device of the buried type is obtained within the apparatus without exposing the wafer to air.

As mentioned above, it is possible to control a surface of the compound semiconductor and to thereby accomplish uniformity, controllability, and reproducibility of grown crystals.

Referring to FIG. 5 in addition to FIG. 1, a method according to a third embodiment of this invention is carried out by the use of the apparatus illustrated in FIG. 1 to manufacture a semiconductor device which is different from that illustrated in FIGS. 3 and 4, as will become clear as the description proceeds. In this event, a substrate 66 of indium phosphide (InP) is prepared and is transported to the MBE chamber 13 (FIG. (1). In the MBE chamber 13, gas source molecular beam epitaxy is performed to grow a layer 67 of indium-gallium-arsenide-phosphide (InGaAsP) which may be called a first layer or a light guide layer. Thus, a wafer 45' is formed in the MBE chamber 13. In the illustrated example, the first layer 67 is deposited to a thickness of 0.5 micron meter. Thereafter, the wafer 45' is transported to the deposition chamber 12.

Figure 5A:
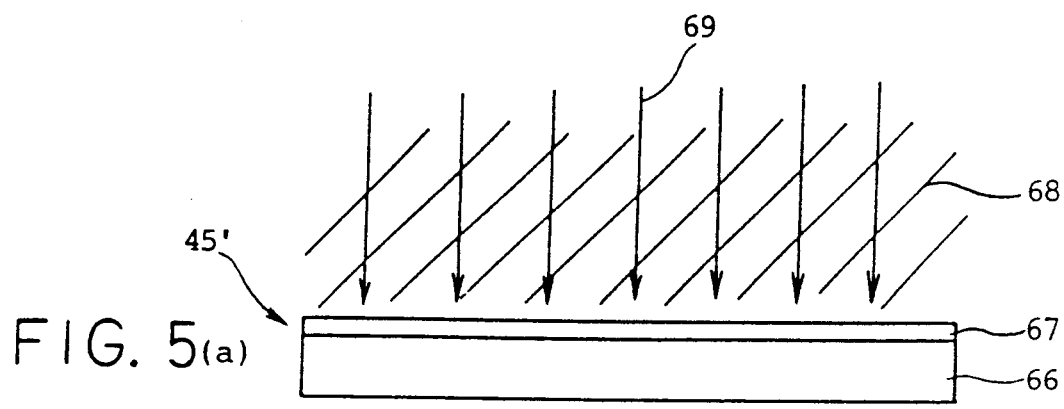
FIGS. 5(a) through (d) are sectional views for use in describing a third embodiment of this invention.
Figure 5B:
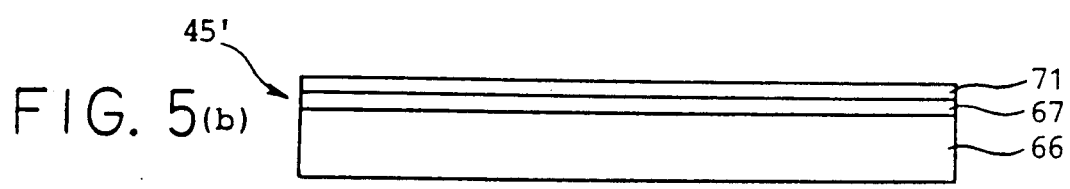

In the deposition chamber 12, oxygen gas 68 and light 69 are irradiated onto the surface of the wafer 45', as shown in FIG. 5(a), in the manner described in conjunction with the first embodiment. The oxygen gas 68 is introduced into the deposition chamber 12 at a pressure of $5 \times 10^{-3}$ Torr. As a result, an oxide layer 71 is formed on the wafer surface, as illustrated in FIG. 5(b).

Figure 5C:
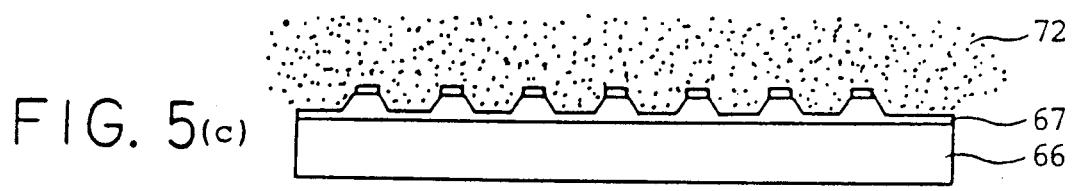

After formation of the oxide layer 71, the wafer 45' is conveyed from the deposition chamber 12 to the etching chamber 14 to be etched therein, as shown in FIG. 5(c). Such etching is carried out by the use of an electron beam and an etching gas 72 composed of bromine and hydrogen at a ratio of 1:10. In this event, a wafer temperature is initially kept at 300° C. and is thereafter raised up to 350° C. The electron beam is scanned on the oxide layer 71 so as to form a grating having a width of 200 nm. When the electron beam is scanned, the oxide layer 71 is selectively etched at areas subjected to irradiation of the electron beam and the first layer 67 is thereafter etched, as illustrated in FIG. 5(c). Thus, the first layer 67 of InGaAsP can be also etched in a manner similar to that illustrated in conjunction with FIG. 3.

Figure 5D:
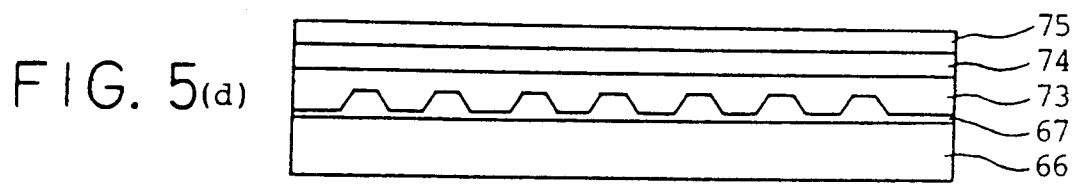

Subsequently, the wafer 45' processed in the above-mentioned manner is sent from the etching chamber 14 to the MBE chamber 13 like in FIG. 4. After an undesired adsorbed molecular layer is removed, as mentioned before, an active layer 73 of InGaAsP, a confinement layer 74 of InP, and a contact layer 75 of InGaAsP are successively grown in the MBE chamber 13 to form the compound semiconductor device, as illustrated in FIG. 5(d). As readily understood from FIG. 5(d), the illustrated device has a mesa configuration which is formed at the areas subjected to irradiation of the electron beam. In the example being illustrated, it has been confirmed that a depth of the mesa configuration is about 0.3 micron meter and a surface thereof provides a mirror surface.

Although each oxide layer is formed in an oxygen atmosphere on condition that light is irradiated on a whole surface of the wafer 45 or 45', such light may be locally irradiated on the wafer. In order to locally irradiate the light on the wafer, a photomask may be used. In this case, the light is projected onto the wafer surface through the photomask to form an oxide layer and to delineate a pattern which is selectively formed by the oxide layer on a wafer surface. Such a pattern may have a size greater than 1 micron meter and may be referred to as a coarse pattern. Under the circumstances, when chlorine gas is brought into contact with the wafer surface, the wafer surface is selectively etched at unpatterned areas with the pattern which remains unetched and which has a large size, as mentioned before. Thereafter, chlorine gas and the electron beam are irradiated on the wafer which has the coarse pattern, so as to delineate a fine pattern.

Thus, it is possible to delineate the coarse pattern by locally irradiating light on a wafer under an oxygen atmosphere and thereafter to delineate the fine pattern by the use of the electron beam. With this method, it is possible to considerably shorten a time for delineating a pattern on a surface of a compound semiconductor.

In the above-mentioned examples, the same gas, such as chlorine gas, is used not only to locally remove an oxide layer but also to etch a compound semiconductor wafer exposed by removal of the oxide layer. In addition, the wafer is successively etched by scanning the electron beam. This means that the oxide layer has a portion initially removed and a portion finally removed and that the wafer has a first part which corresponds to the initially removed portion and which is exposed to the chlorine gas for a comparatively long time and a second part which corresponds to the finally removed portion and which is exposed to the chlorine gas for a short time. As readily understood from the above, the first part is etched deeper than the second part and an etching depth is varied on the wafer. In order to avoid such variation of the etching depth, different gases may be used to form a pattern by partially removing the oxide layer and to transfer the pattern on the compound semiconductor wafer by etching the wafer through the oxide layer partially removed. More specifically, a hydrogen gas may be used as a gas for forming a pattern by removing the oxide layer while a chlorine gas may be used as a gas for etching gas.

In this case, the oxide layer can partially be removed only at portions at which both the hydrogen gas and the electron beam are irradiated. This may be because the oxide layer on the wafer reacts with the hydrogen gas by the help of the electron beam. It has been found out that the compound semiconductor wafer itself is etched at a negligible etching rate on irradiation of both the hydrogen gas and the electron beam and that the pattern is substantially formed only on the oxide layer with the compound semiconductor wafer substantially unetched. When the pattern is thus formed all over the oxide layer, irradiation of both the hydrogen gas and the electron beam is stopped. Subsequently, the chlorine gas is uniformly irradiated on the compound semiconductor wafer to etch the wafer. Practically, when such etching is performed twenty minutes with a pressure of the chlorine gas kept at $10^{-4}$ Torr on condition that the compound semiconductor wafer is kept at 80° C., the etching depth is about 0.8 micron meter and is substantially uniform over the whole surface of the compound semiconductor wafer.

In the example being illustrated, the oxide layer alone has been formed as a mask layer on the compound semiconductor wafer. Instead of the oxide layer, it has been confirmed that a sulphide layer or a nitride layer may be deposited on the wafer and serves to form a pattern by irradiating an etching gas and an electron beam. Such sulphide and nitride layers can be deposited by bringing hydrogen sulphide ($H_2S$) and ammonia ($NH_3$) into contact with the compound semiconductor wafer, respectively, and by simultaneously irradiating light on the wafer.

While this invention has thus far been described in conjunction with a few embodiments thereof, it will readily be possible for those skilled in the art to put this invention into practice in various other manners. For example, the compound semiconductor may be InAs, InSb, GaP, InGaAlP, AlGaAsSb, or the like. In addition, the light source may be a He-Ne laser, an Ar ion laser, a Kr laser, a tungsten lamp, a mercury lamp, a natrium lamp, or the like.

What is claimed is:

1. A method of processing a wafer which is composed of a compound semiconductor and which has a wafer surface, said method comprising the steps of:
   forming a specific layer on said wafer surface; and
   selectively etching said specific layer by introducing an electron beam and a specific gas onto said specific layer to form a predetermined pattern on said wafer surface.

2. A method as claimed in claim 1, wherein said specific layer formation step comprises the step of:
   spraying a preselected gas onto said wafer surface to adsorb said specific layer and to form an adsorbed molecular layer of said preselected gas to said wafer surface.

3. A method as claimed in claim 1, wherein said specific layer formation step comprises the step of:
   spraying a prescribed gas onto said wafer surface to make said prescribed gas react with said compound semiconductor and to form a chemically reacted layer on said wafer surface as said specific layer.

4. A method as claimed in claim 1, wherein said specific layer formation step comprises the steps of:
   bringing a gas including an oxygen into contact with said wafer surface; and
   irradiating light onto said wafer surface to make said gas react with said compound semiconductor by the help of light and to form an oxide layer of said compound semiconductor as said specific layer.

5. A method as claimed in claim 1, wherein said specific layer formation step comprises the step of:
   contacting, with said wafer surface, a predetermined gas including at least one material selected from a group consisting of sulfur, nitrogen, and their compounds to form said specific layer.

6. A method as claimed in claim 5, wherein said specific layer formation step further comprises, after said contacting step, the step of:
   irradiating said wafer surface by light to form said specific layer.

7. A method as claimed in claim 4 or 6, wherein said light is locally irradiated only on a preselected region of said wafer surface.

8. A method as claimed in claim 1, wherein said selective etching step comprises the step of:
   simultaneously supplying both said electron beam and said specific gas onto said specific layer.

9. A method as claimed in claim 1, wherein said selective etching step comprises the step of:
   individually supplying said electron beam and said specific gas onto said specific layer at different time instants.

10. A method as claimed in claim 1, wherein said selective etching step comprises the steps of:
    heating said wafer to a preselected temperature; and
    introducing both said electron beam and said specific gas onto said wafer heated.

11. A method as claimed in claim 1, wherein said selective etching step is carried out by said gas including at least one material selected from a group consisting of chlorine, bromine, iodine, their compounds, and their radicals.

12. A method as claimed in claim 1, wherein said selective etching step comprises the steps of:
    selecting, as said specific gas, a first gas which can not etch said compound semiconductor;
    spraying said first gas on said specific layer;
    locally irradiating said electron beam on said specific layer to locally remove said specific layer and thereby to partially expose said wafer surface;
    selecting a second gas which can not etch said specific layer but can etch said compound semiconductor; and
    irradiating said second gas onto the compound semiconductor partially exposed during said locally irradiating step of said electron beam to remove the compound semiconductor partially exposed.

13. A method as claimed in claim 1, further comprising the steps of:
    heating said wafer at a temperature such that said specific layer can be removed; and
    growing an epitaxial layer on the wafer surface.

14. A method as claimed in claim 13, wherein said heating step comprises the steps of:
    heating said wafer above the temperature at which said specific layer can be evaporated; and
    irradiating simultaneously the vapor of V-column element which is constituent of said compound semiconductor.

15. A method as claimed in claim 13, wherein all steps are carried out without exposing said wafer surface to air.

16. An apparatus for use in processing a compound semiconductor wafer which has a wafer surface and which comprises a compound semiconductor substrate and an epitaxial growth layer, said apparatus comprising:
    a growth chamber for growing said epitaxial layer on said compound semiconductor substrate;
    a deposition chamber for forming a specific layer on said epitaxial growth layer;
    an etching chamber for etching said specific layer and said epitaxial growth layer; and
    a coupling member for airtightly coupling said growth chamber, said deposition chamber, and said etching chamber to one another so that said substrate and said wafer are transported from one chamber to another without being exposed to air.

* * * * *

UNITED STATES PATENT AND TRADEMARK OFFICE
CERTIFICATE OF CORRECTION

PATENT NO. : 4,994,140

DATED : February 19, 1991

INVENTOR(S) : Kenzo AKITA et al

It is certified that error appears in the above-identified patent and that said Letters Patent is hereby corrected as shown below:

Title Page:

In item [19] change "Kenzo" to --Akita--.
In [75] Inventors, change "Akita Kenzo" to --Kenzo Akita--;

In [30] Foreign Application Priority Date, change "1-62683" to --1-162683--

Signed and Sealed this

Twenty-second Day of September, 1992

Attest:

DOUGLAS B. COMER

Attesting Officer     Acting Commissioner of Patents and Trademarks